US012754261B2

(12) United States Patent
Igarashi et al.

(10) Patent No.: US 12,754,261 B2
(45) **Date of Patent: *Oct. 6, 2026**

(54) FLUORESCENCE DETECTING DEVICE, AND FLUORESCENCE DETECTING METHOD

(71) Applicant: National Institutes for Quantum Science and Technology, Chiba (JP)

(72) Inventors: Ryuji Igarashi, Chiba (JP); Tamami Yanagi, Chiba (JP); Kiichi Kaminaga, Chiba (JP)

(73) Assignee: National Institutes for Quantum Science and Technology, Chiba (JP)

( * ) Notice: Subject to any disclaimer, the term of this patent is extended or adjusted under 35 U.S.C. 154(b) by 144 days.

This patent is subject to a terminal disclaimer.

(21) Appl. No.: 18/572,265

(22) PCT Filed: Jun. 22, 2022

(86) PCT No.: PCT/JP2022/024793

§ 371 (c)(1),
(2) Date: Dec. 20, 2023

(87) PCT Pub. No.: WO2022/270520

PCT Pub. Date: Dec. 29, 2022

(65) Prior Publication Data

US 2024/0288517 A1 Aug. 29, 2024

(30) Foreign Application Priority Data

Jun. 23, 2021 (JP) ................................ 2021-104441

(51) Int. Cl.
*G01R 33/26* (2006.01)

(52) U.S. Cl.
CPC .................................. *G01R 33/26* (2013.01)

(58) Field of Classification Search
CPC .......................... G01R 33/26; G01R 33/0005; G01R 33/0017; G01R 33/032; G01R 33/0354
See application file for complete search history.

(56) References Cited

U.S. PATENT DOCUMENTS 5,909,278 A * 6/1999 Deka .................... G01J 3/4406 356/73
2011/0062957 A1* 3/2011 Fu ....................... G01N 24/088 324/307
(Continued)

FOREIGN PATENT DOCUMENTS

CN 102272575 12/2011
CN 109143121 A 1/2019
(Continued)

OTHER PUBLICATIONS

Claveau, Sandra et al: "Harnessing subcellular-resolved organ distribution of cationic copolymer-functionalized fluorescent nanodiamonds for optimal delivery of active siRNA to a xenografted tumor in mice", Nanoscale, vol. 13, No. 20, May 27, 2021 (May 27, 2021), pp. 9280-9292, XP093272710, United Kingdom.
(Continued)

*Primary Examiner* — Lee E Rodak
*Assistant Examiner* — Taqi R Nasir
(74) *Attorney, Agent, or Firm* — NK Patent Law

(57) ABSTRACT

Provided is a technique of identifying fluorescence emitted from a measurement target, with a simpler device configuration. A fluorescence detection device includes: a generating section that generates pulsed laser light which causes spin polarization and spin relaxation in a phosphor that emits fluorescence whose intensity varies according to magnetic resonance; and a modulating section that modulates the pulse frequency of the pulsed laser light.

8 Claims, 14 Drawing Sheets

(56) References Cited

U.S. PATENT DOCUMENTS

| | | | |
|---|---|---|---|
| 2011/0278471 A1 | 11/2011 | Hoshishima | |
| 2017/0343695 A1* | 11/2017 | Stetson | G01V 3/101 |
| 2017/0370979 A1* | 12/2017 | Braje | G01R 29/0885 |
| 2018/0120219 A1 | 5/2018 | Bumb et al. | |
| 2019/0277842 A1 | 9/2019 | Cleveland | |
| 2020/0334559 A1 | 10/2020 | Anderson et al. | |

FOREIGN PATENT DOCUMENTS

| | | | |
|---|---|---|---|
| CN | 109342548 | A | 2/2019 |
| DE | 102018220234 | A1 | 5/2020 |
| JP | 10104181 | A | 4/1988 |
| JP | 2000210246 | A | 8/2000 |
| JP | 2011180570 | A | 9/2011 |
| JP | 2012211811 | A | 11/2012 |
| JP | 2018136316 | A | 8/2018 |
| JP | 2021510837 | A | 4/2021 |
| RU | 2412486 | C1 | 2/2011 |

OTHER PUBLICATIONS

EPO, Extended European Search Report for corresponding European Patent Application No. 22828435.2, mailed May 12, 2025, 10 pages.

EPO, Extended European Search Report for corresponding European Patent Application No. 22828436.0, mailed May 12, 2025, 8 pages.

Igarashi, Ryuji et al: "Real-Time Background-Free Selective Imaging of Fluorescent Nanodiamonds in Vivo", NANO Letters, Mar. 11, 2020 American Chemical Society, US, vol. 12, No. 11, Oct. 22, 2012 (Oct. 22, 2012), pp. 5726-5732, XP093272703.

Sarkar, Susanta K. et al: "Wide-field in vivo background free imaging by selective magnetic modulation of nanodiamond fluorescence", Biomedical Optics Express, vol. 5, No. 4, Mar. 14, 2014 (Mar. 14, 2014), p. 1190, XP055594652, United States.

Yang, Bo et at: "Using Diamond Quantum Magnetometer to Characterize Near-Field Distribution of Patch Antenna", Ieee Transactions on Microwave Theory and Techniques, IEEE, USA, vol. 67, No. 6, Jun. 1, 2019 (Jun. 1, 2019), pp. 2451-2460, XP011727972.

Yanagi, Tamami et al., "All-Optical Wide-Field Selective Imaging of Fluorescent Nanodiamonds in Cells, in Vivo and Ex Vivo", ACS Nano, published Aug. 2, 2021, vol. 15, No. 8, p. 12869-p. 12879.

ISA/JP; International Search Report and Written Opinion for corresponding International Patent Application No. PCT/JP2022/024792, mailed Aug. 30, 2022, 13 pages.

ISA/JP; International Search Report and Written Opinion for corresponding International Patent Application No. PCT/JP2022/024793, mailed Aug. 30, 2022, 11 pages.

USPTO, Office Action for corresponding U.S. Appl. No. 18/572,231, dated Jul. 14, 2025, 25 pages.

CNIPA; The First Office Action for corresponding Chinese Patent Application No. 202280042590.7, dated Mar. 21, 2026, 22 pages.

CNIPA; The First Office Action for corresponding Chinese Patent Application No. 202280042966.4, dated Mar. 11, 2026, 15 pages.

Liu Gang-Qin et al., "Quantum control of nitrogen-vacancy center in diamond", Acta Physica Sinica, vol. 67, No. 12 (2018), 43 pages.

Zhou Shuyu et al.; Progress in Laser-Cooled Atom Experiments at the Quantum Optics Laboratory of the Shanghai Institute of Optics and Mechanics, Proceedings of the 9th National Conference on Quantum Optics (vol. I), dated Jul. 18, 2000, 3 pages.

* cited by examiner

FLUORESCENCE DETECTING DEVICE, AND FLUORESCENCE DETECTING METHOD

CROSS-REFERENCE TO RELATED APPLICATIONS

This application is a U.S. National Stage Application of International Patent Application No. PCT/JP2022/024793, filed on Jun. 22, 2022, which claims priority to Japanese Patent Application No. 2021-104441, filed on Jun. 23, 2021, the entire contents of all of which are incorporated by reference herein.

TECHNICAL FIELD

The present invention relates to a fluorescence detection device and a fluorescence detection method.

BACKGROUND ART

There are known analytical methods in which fluorescence emitted when excited electrons return to a ground state is used. For example, a diamond having a nitrogen-vacancy center (NV center), which contains nitrogen that substitutes for a carbon atom and a vacancy that is adjacent to the nitrogen, is known as a phosphor which allows the intensity of fluorescence emitted from the NV center to be controlled by magnetic resonance. Various methods of using a minute diamond (nanodiamond) having an NV center, such as use thereof as a marker or a magnetic sensor each of which generates fluorescence, have been studied.

In a case where a nanodiamond is used as a marker that generates fluorescence, there is a problem that it is difficult to distinguish between fluorescence emitted from an NV center and fluorescence emitted from the others. Patent Literature 1 discloses a fluorescence microscope that makes it possible to carry out selective field observation of fluorescence of interest. In this technique, an NV center included in a measurement target is irradiated with a high-frequency magnetic field so that the intensity of fluorescence emitted from the NV center is changed. This makes it possible to distinguish between the fluorescence which is emitted from the NV center and fluorescence which is emitted from an object other than the NV center and whose intensity does not change.

CITATION LIST

Patent Literature

[Patent Literature 1]
Japanese Patent Application Publication Tokukai No. 2011-180570

SUMMARY OF INVENTION

Technical Problem

However, in the above-described conventional technique, the intensity of a magnetic field is changed so that the intensity of fluorescence emitted from an NV center is changed. However, this method has a problem that a device configuration is complex and large-sized, because, in order to cause magnetic resonance of the NV center, it is necessary to simultaneously carry out irradiation with a microwave in addition to a device for generating the magnetic field and changing the intensity of the magnetic field.

The object of an aspect of the present invention is to provide a technique of identifying fluorescence emitted from a measurement target, with a simpler device configuration.

Solution to Problem

In order to attain the above object, a fluorescence detection device in accordance with an aspect of the present invention includes: a generating section that generates pulsed laser light which causes spin polarization and spin relaxation in a phosphor that emits fluorescence whose intensity varies according to magnetic resonance; and a modulating section that modulates a pulse frequency of the pulsed laser light.

In order to attain the above object, a fluorescence detection method in accordance with an aspect of the present invention is a method for detecting fluorescence which is emitted from a phosphor and whose intensity varies according to magnetic resonance, the method including the steps of: irradiating the phosphor with pulsed laser light so that the phosphor emits the fluorescence; and changing a pulse frequency of the pulsed laser light so that the intensity of the fluorescence emitted from the phosphor is changed.

Advantageous Effects of Invention

According to an aspect of the present invention, it is possible to provide a technique of identifying fluorescence emitted from a measurement target, with a simpler device configuration.

DESCRIPTION OF EMBODIMENTS

Embodiment 1

Figure 1:
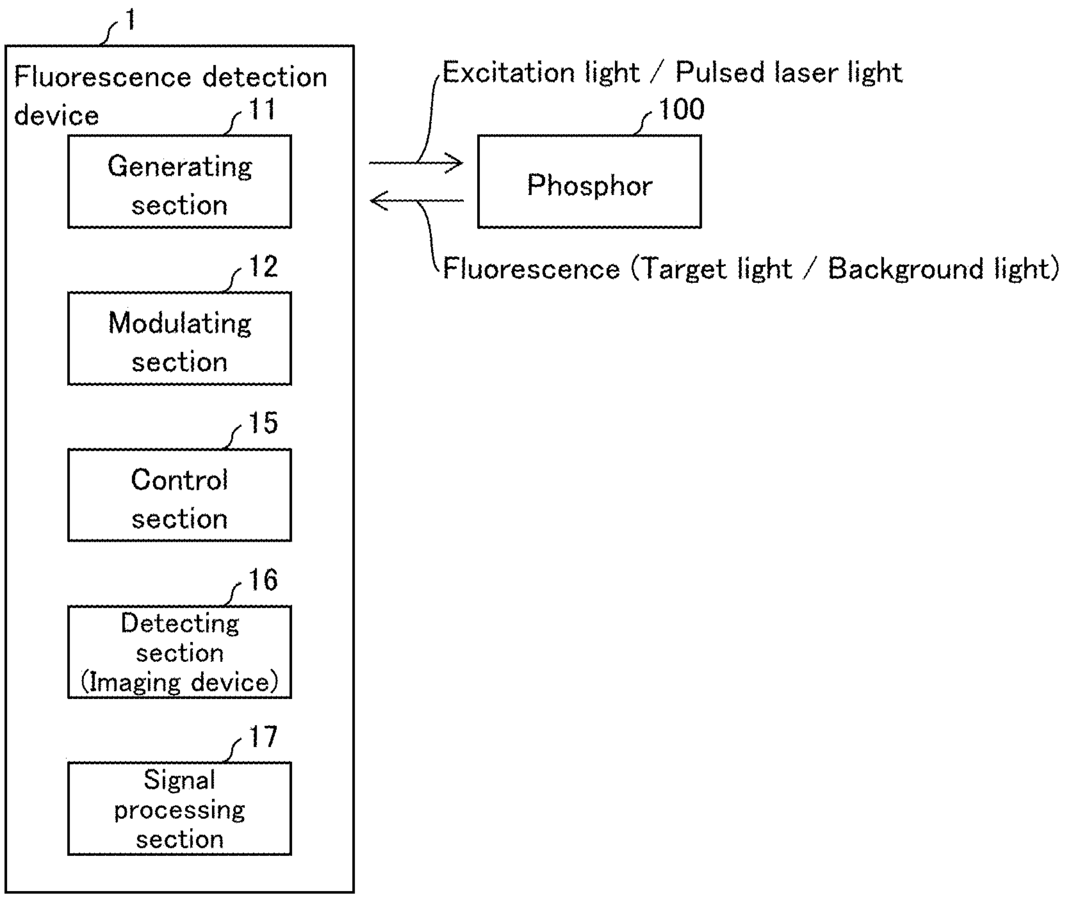
FIG. 1 is a block diagram of a fluorescence detection device 1 in accordance with Embodiment 1 of the present invention.

The following description will discuss, in detail, an embodiment of the present invention with reference to drawings. FIG. 1 is a block diagram of a fluorescence detection device 1 in accordance with Embodiment 1. As illustrated in FIG. 1, the fluorescence detection device 1 includes a generating section 11, a modulating section 12, a control section 15, a detecting section (imaging device) 16, and a signal processing section 17.

The generating section 11 generates pulsed laser light which causes spin polarization and spin relaxation in a phosphor that emits fluorescence whose intensity varies according to magnetic resonance. The phosphor is a substance which emits energy as visible light when an energy state of electrons of an atom or a molecule transitions from an excited state to a ground state. The phosphor that emits fluorescence whose intensity varies according to magnetic resonance is, for example, a phosphor that emits fluorescence whose intensity changes in a case where a spin state of electrons present in a crystal lattice defect is changed by magnetic resonance.

For example, in a case where a lattice defect structure in a diamond which lattice defect structure contains a nitrogen atom that substitutes for a carbon atom and a vacancy that is adjacent to the nitrogen atom (referred to as an NV center) is irradiated with green light (wavelength: 495 nm to 570 nm) or light having a wavelength twice the wavelength of the green light, electrons transition to an excited state, and then emit fluorescence of red light when the electrons return to a ground state. In this case, the NV center of the diamond is the phosphor, and the green light or the light having a wavelength twice the wavelength of the green light is excitation light that excites the phosphor.

Specifically, in the case of the NV center of the diamond, in a case where a spin magnetic quantum number in the ground state is $m_s=0$, almost all of excited electrons transition to $m_s=0$ in the ground state again while emitting fluorescence of 650 nm to 750 nm. In contrast, in a case where the spin magnetic quantum number is $m_s=\pm1$, approximately 50% of the excited electrons undergo intersystem crossing to a singlet state, and transition to $m_s=0$ in the ground state without emitting fluorescence. Therefore, in a case where photoexcitation is carried out for a sufficiently long time (several microseconds), almost 100% of triplet electrons are pumped to $m_s=0$. This spin-dependent optical property causes a difference of approximately 5% to 10% in fluorescence intensity between a thermal equilibrium state and a pumped state. The following embodiment is described while the NV center of the diamond (hereinafter, simply referred to as "NV center") is taken as an example of a phosphor 100. Note that the diamond used for fluorescence measurement is a nano-sized diamond and, therefore, this diamond is also referred to as a fluorescent nanodiamond.

In the present embodiment, the pulsed laser light which is ejected in a pulsed manner (intermittently) is used to change the intensity of the fluorescence emitted from the NV center (measurement target). In a case where the NV center is irradiated with the pulsed laser light in green, the spin polarization and the spin relaxation occurs in the NV center. The spin polarization indicates a non-equilibrium state in which spin is present biasedly in a specific direction. The spin relaxation indicates a phenomenon in which non-equilibrium spin returns to an equilibrium state. This causes a change in the ratio between $m_s=0$ and $m_s=\pm1$, and therefore the intensity of the fluorescence emitted from the NV center is changed. Hereinafter, the fluorescence emitted from the measurement target is also referred to as "target light". Fluorescence emitted from an object other than the measurement target is also referred to as "background light".

The modulating section 12 has a role of changing the intensity of the fluorescence emitted from the NV center. Specifically, the modulating section 12 modulates the pulse frequency of the pulsed laser light. The pulse frequency is the number of ejections of pulses per unit time. By changing the pulse frequency, it is possible to change a degree of the spin relaxation. In the case of the NV center, the degree of the spin relaxation can be defined as the proportion of NV of $m_s=\pm1$. As the degree of the spin relaxation becomes greater, the intensity of the fluorescence becomes lower. The range in which the modulating section 12 modulates the pulse frequency may be a range between 100 Hz and 200 MHz, preferably a range between 1 kHz and 1000 kHz, and more preferably a range between 10 kHz and 500 kHz. By modulating the pulse frequency in such a range, it is possible to carry out measurement with improved accuracy. In a case where the modulated pulse frequency falls below 100 Hz, a measurement time becomes long and time resolution decreases. Therefore, this is not preferable.

A pulse width (time for which a pulse is ejected) is not less than 100 ns. The pulse width is preferably 200 ns to 100 μs, and more preferably 300 ns to 10 μs. Each pulse may be continuous light, or may be pulsed light ejected intermittently. In the present disclosure, the intensity of the background light may or may not be changed. In the present embodiment, the intensity of the background light is not changed by making the number of ejections of pulses at each data point uniform and making the intensity of the pulses constant. Note that, in the present embodiment, the pulsed laser light also functions as excitation light and therefore the phosphor 100 does not need to be irradiated with excitation light for exciting the NV center.

As a specific configuration of the fluorescence detection device 1, the generating section 11 is, for example, a laser oscillator. The modulating section 12 is a signal generating section that generates a signal for oscillating laser light in a pulsed manner and modulating the pulse frequency of these pulses. The modulating section 12 transmits the generated signal to the generating section 11. With such a configuration, the fluorescence detection device 1 is capable of ejecting the pulsed laser light whose pulse frequency is modulated. The fluorescence detection device 1 irradiates the phosphor 100 with the pulsed laser light whose pulse frequency is modulated.

Note that a method in which the modulating section 12 modulates the pulsed laser light includes, for example, internal modulation and external modulation. The internal modulation is a method of ejecting the pulsed laser light whose pulse frequency is modulated, by carrying out oscillation in a pulsed manner in the generating section (laser oscillator) 11. The external modulation is a method of converting laser light ejected as continuous light into pulsed light having a given pulse frequency (or pulse intensity) via an acousto-optic modulator (AOM), an electro-optic modulator (EOM), or the like.

The control section 15 controls the entire fluorescence detection device 1. As the control section 15, any of various processors, such as a central processing unit (CPU), a micro processing unit (MPU), an application specific integrated circuit (ASIC), or a programmable logic device (PLD), can be used. The control section 15 includes a storage part (not illustrated) such as a read only memory (ROM) or a random access memory (RAM). In the storage part, various control programs and various pieces of data are stored. The control section 15 integrally controls the generating section 11, the modulating section 12, the detecting section 16 (described later), and the signal processing section 17.

The detecting section (imaging device) 16 includes an imaging element such as a charge coupled device (CCD) or a complementary metal oxide semiconductor (CMOS), and receives the target light and the background light. The imaging element converts, for each pixel, the received fluorescence into an electric signal. The detecting section 16 transmits, to the signal processing section 17, electric signals obtained by the conversion.

The signal processing section 17 processes the electric signals received from the detecting section 16, and identifies the target light and the background light. Specifically, the signal processing section 17 distinguishes, for each pixel, a pattern of changes in the electric signal which pattern of changes corresponds to the fluorescence intensity of the target light. The signal processing section 17 then extracts pixels indicating the same pattern of changes as a pattern of changes in the intensity of the pulsed laser light which intensity is modulated by the modulating section 12. The signal processing section 17 may generate and output an image of the extracted pixels. The image generated by the signal processing section 17 is outputted to and displayed on a display provided to the fluorescence detection device 1 or an external display.

The pattern of changes in the electric signal will be described in more detail. In a case where the pulsed laser light is modulated so that the target light is changed, the intensity of the target light changes in synchronization with the modulation. The pattern of changes in the electric signal includes a pattern of change widths of intensity and a phase pattern of changes. The change widths of the intensity correspond to the change widths of the frequency of the pulsed laser light. The phase pattern of changes corresponds to a pattern of ejection of the pulsed laser light. That is, a signal captured in a pixel in which a pattern of changes in the intensity of the signal synchronizes with such a pattern of changes is the electric signal generated by the target light. Therefore, by extracting such a signal, it is possible to extract and identify the target light.

Figure 2:
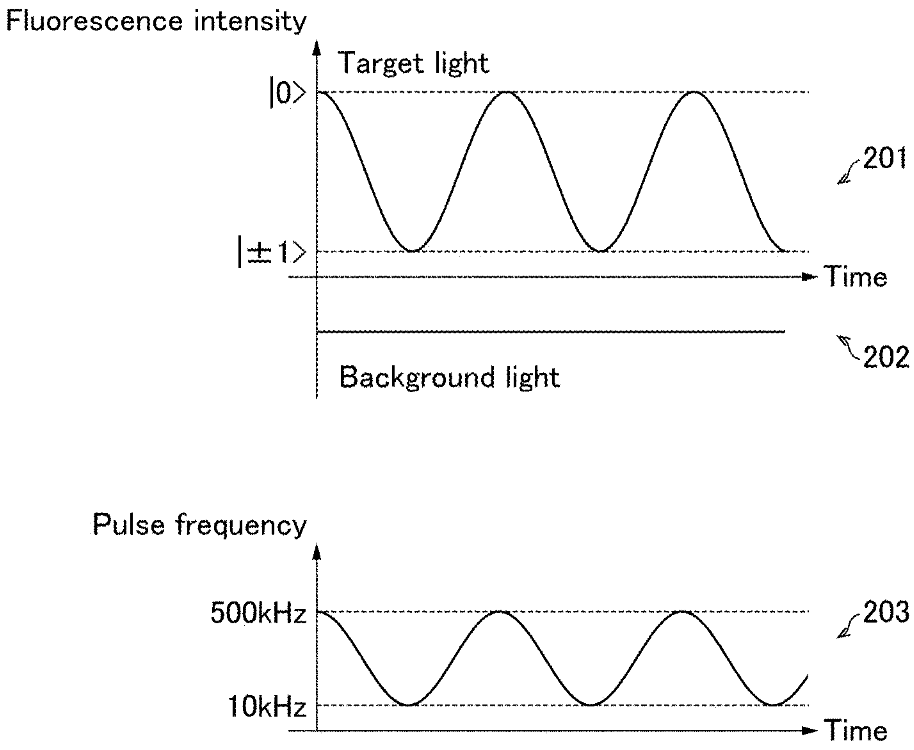
FIG. 2 illustrates a relationship between the pulse frequency of pulsed laser light and the intensity of target light, in accordance with Embodiment 1.

FIG. 2 illustrates a relationship between the pulse frequency of the pulsed laser light and the intensity of the target light. 203 of FIG. 2 shows a pattern of changes in the pulse frequency of the pulsed laser light, and 201 of FIG. 2 shows a pattern of changes in the intensity of the target light. As shown in FIG. 2, the pattern of changes in the intensity of the target light synchronizes with the pattern of changes in the pulse frequency of the pulsed laser light.

Meanwhile, as shown in 202 of FIG. 2, the intensity of the background light is constant, regardless of the changes in the pulse frequency. This is because, in a case where the number of ejections of the pulsed laser light at each data point is constant, an energy state of electrons of a substance that generates the background light does not change by the pulse frequency of the pulsed laser light. Therefore, it is possible to detect and identify only the target light that is a measurement target, by locking in and extracting, by signal processing, only fluorescence that synchronizes with the pattern of changes in the pulse frequency of the pulsed laser light.

In a case where the phosphor 100 is irradiated with excitation light, not only the target light is emitted from the phosphor 100, but also fluorescence is emitted as the background light from a surrounding object. In a case where the target light and the background light are imaged as they are and in a case where the wavelengths of the target light and the background light are close to each other, it is not possible to distinguish between the target light and the background light. However, the fluorescence detection device 1 in accordance with the present embodiment includes the generating section 11 that generates the pulsed laser light and the modulating section 12 that modulates the pulse frequency of the pulsed laser light. This makes it possible to separate the target light from the background light and detect the target light.

Moreover, the generating section 11 and the modulating section 12 used in the present embodiment are simple in configuration, as compared with a device that is used in the conventional technique and that generates a high-frequency magnetic field (a radio wave, a microwave, or the like) or a magnetic field. Therefore, an effect that it is possible to provide a technique of identifying fluorescence emitted from a measurement target with a simpler device configuration as compared with the conventional technique.

(Fluorescence Detection Method)

Figure 3:
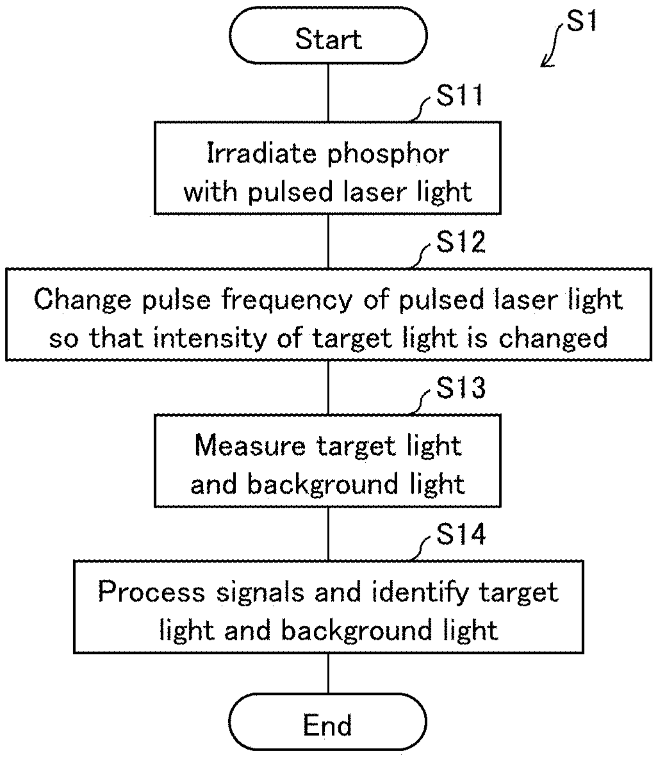
FIG. 3 is a flowchart illustrating a flow of a fluorescence detection method S1 in accordance with Embodiment 1.

Next, a fluorescence detection method will be described. FIG. 3 is a flowchart illustrating a flow of a fluorescence detection method S1 in accordance with the present embodiment. As illustrated in FIG. 3, the fluorescence detection method S1 includes, as an example, steps S11 through S14. First, in the step S11, the fluorescence detection device 1 irradiates the phosphor 100 with pulsed laser light so that the phosphor 100 emits fluorescence. Next, in the step S12, the pulse frequency of the pulsed laser light is changed so that the intensity of target light (the fluorescence emitted from the phosphor 100) is changed. Next, in the step S13, fluorescence including background light is measured. Next, in the step S14, signals corresponding to the measured fluorescence are processed, and the target light and the background light are identified.

The fluorescence detection method S1 in accordance with the present embodiment brings about an effect that it is possible to provide a technique of identifying fluorescence emitted from a measurement target with a simpler device configuration as compared with the conventional technique.

Figure 7:
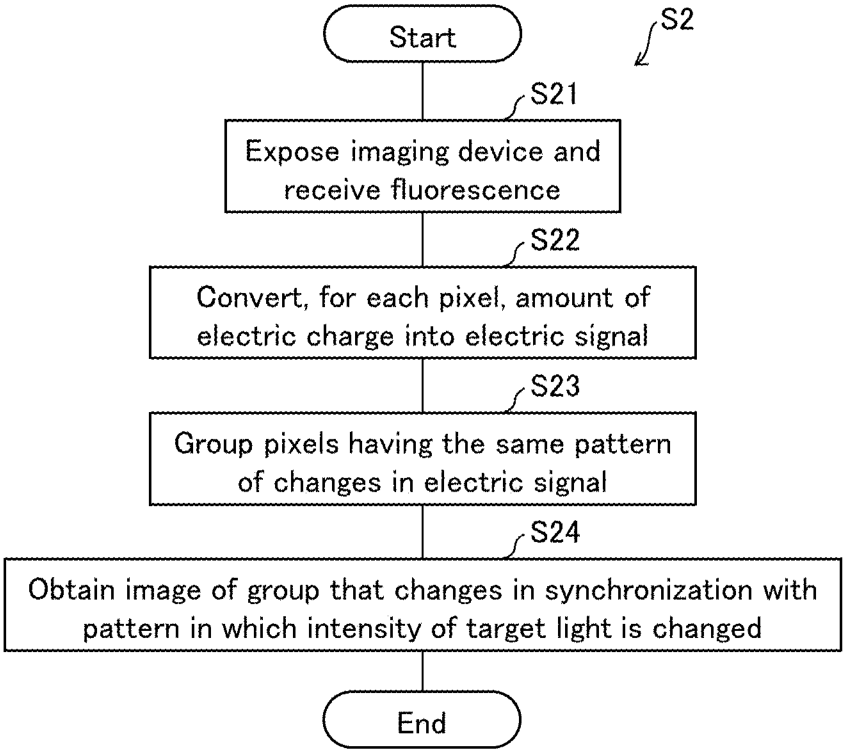
FIG. 7 is a flowchart illustrating a flow of a fluorescence identification method S2 in accordance with Embodiment 1.

Next, an example of a method of measuring fluorescence and identifying target light and background light will be described. FIG. 7 is a flowchart illustrating a flow of a fluorescence identification method S2. As illustrated in FIG. 7, the fluorescence identification method S2 includes, as an example, steps S21 through S24. First, in the step S21, the fluorescence detection device 1 exposes the imaging device 16 and receives fluorescence. Next, in the step S22, the fluorescence detection device 1 converts, for each pixel, the amount of electric charge into an electric signal. Next, in the step S23, the fluorescence detection device 1 groups pixels having the same pattern of changes in the electric signal. Next, in step S24, the fluorescence detection device 1 obtains an image of a pixel group that changes in synchronization with a pattern in which the intensity of target light is changed. The above-described fluorescence identification method S2 makes it possible to identify merely the target light.

Note that the present embodiment has been described while the phosphor containing the NV center of the diamond is taken as an example of the phosphor. However, the phosphor that can be applied in the present embodiment is not limited to this phosphor. For example, the phosphor may be, other than the NV center of the diamond, an SiV center which contains a silicon atom that substitutes for a carbon atom and a vacancy defect that is adjacent to the silicon atom, a $V_{Si}V_C$ center of a silicon carbide crystal which $V_{Si}V_C$ center contains a vacancy defect that substitutes for a silicon atom and a vacancy defect that is adjacent to the vacancy defect, or a $V_{Si}$ center of a silicon carbide crystal which $V_{Si}$ center contains a vacancy defect that substitutes for a silicon atom.

(Measurement of Biological Sample)

The fluorescence detection device 1 in accordance with the present embodiment can be used to detect a complex of an antibody and a phosphor (an antibody-phosphor complex). This makes it possible to realize highly sensitive detection of an antigen to which the antibody specifically binds.

Further, an interaction that can be detected by the fluorescence detection device 1 is not limited to an antigen-antibody reaction. Examples of the interaction include an interaction between a ligand and a receptor, binding between a ligand and a protein having a binding domain, and a specific interaction between complementary strands in a nucleic acid and a nucleic acid-like low molecular weight compound. Further, it is possible to highly sensitively detect a protein-protein interaction, a protein-peptide interaction, a protein-low molecular weight compound interaction, a specific covalent binding reaction between proteins each having a sequence that covalently binds to a specific peptide sequence, each of which is conventionally known.

A detection target of the antibody is not particularly limited, and only needs to be an antigen to which the antibody specifically binds. Examples of the detection target include peptides, proteins, nucleic acids (such as DNA and RNA), sugars, and lipids. As the antibody, any of polyclonal antibodies, monoclonal antibodies, and fragments thereof (e.g., Fab, F(ab)2, and the like) can be used. Further, the class and the subclass of an immunoglobulin is not particularly limited. The antibody may be one that is selected from an antibody library by a phage display method or the like, or can be a conventionally-known antibody.

The kinds of ligands are not particularly limited, and examples of the ligands include, but are not limited to, proteins, peptides, amino acids, metal ions, low molecular weight substances, organic compounds, inorganic compounds, polysaccharides, nucleic acids, and lipids.

The fluorescence detection device 1 can also be used to detect a specific substance in a sample collected from a living body.

Examples of the sample collected from the living body include blood samples and spinal fluid (cerebrospinal fluid). The blood samples include whole blood, blood plasma, and blood serum. The blood samples are preferably blood plasma or blood serum, and more preferably blood plasma. Blood plasma can be separated from whole blood collected with a heparin salt (preferably sodium salt), a citrate (preferably sodium salt), or an ethylenediamine tetraacetic acid (EDTA) salt (preferably sodium salt or potassium salt). Blood plasma is more preferably blood plasma separated from whole blood collected with an EDTA salt or a heparin salt. The sample is not limited to these examples, provided that the sample is a living body-derived sample such as urine, perspiration, tears, cells, or tissue. A cell culture solution of a living body-derived cell, a cultured cell strain, or the like can also be the sample.

Examples of the living body include mammals, birds, reptiles, and amphibians. Among others, the mammals are preferable. Examples of the mammals include humans and non-human animals. The humans are preferable. Examples of the non-human animals include: domestic animals such as cattle, horses, pigs, and sheep; and pet animals and laboratory animals such as dogs, cats, rats, mice, hamsters, monkeys, and rabbits. Examples of the birds include poultry such as chickens, wild ducks, and domestic ducks.

Examples of the specific substance in the biological sample include: disease biomarkers that are known to be useful in identifying diseases; specific nucleic acid sequences; specific peptide sequences; and specific amino acid sequences. However, the specific substance is not limited to these examples.

The fluorescence detection device 1 can also be used for in vitro test and diagnosis of a target disease, by using a disease biomarker as a detection target.

Alternatively, the fluorescence detection device 1 can be used for in vitro test and diagnosis of a virus infection or the like by using, as a detection target, an antigen such as a nucleic acid sequence or the like derived from a virus, bacteria, or a microorganism.

Alternatively, it is also possible to detect a specific substance in a sample collected from an object other than a living body. For example, the fluorescence detection device 1 can be used for an environmental microorganism test by using, as a detection target, a microorganism or the like collected from an environment, food, water, soil, or the like.

The fluorescence detection device 1 can be used as an in vitro diagnostic device, and the fluorescence detection method can be used as an in vitro diagnostic method.

The fluorescence detection device 1 is capable of detecting a fluorescence-labeled nucleic acid. It is possible to detect amplification of a nucleic acid by detecting the amount of fluorescence incorporated in a complementary strand of the nucleic acid (DNA, RNA, or the like).

The fluorescence detection device 1 can be used as a nucleic acid amplification detection device, and the fluorescence detection method can be used as a nucleic acid amplification detection method.

Embodiment 2

The following description will discuss another embodiment of the present invention. Note that, for convenience, members having the same functions as those of the members described in the above embodiment are given respective identical reference numerals, and descriptions of those members are omitted. In the present embodiment, an example will be described in which the intensity of background light is also changed.

Figure 4:
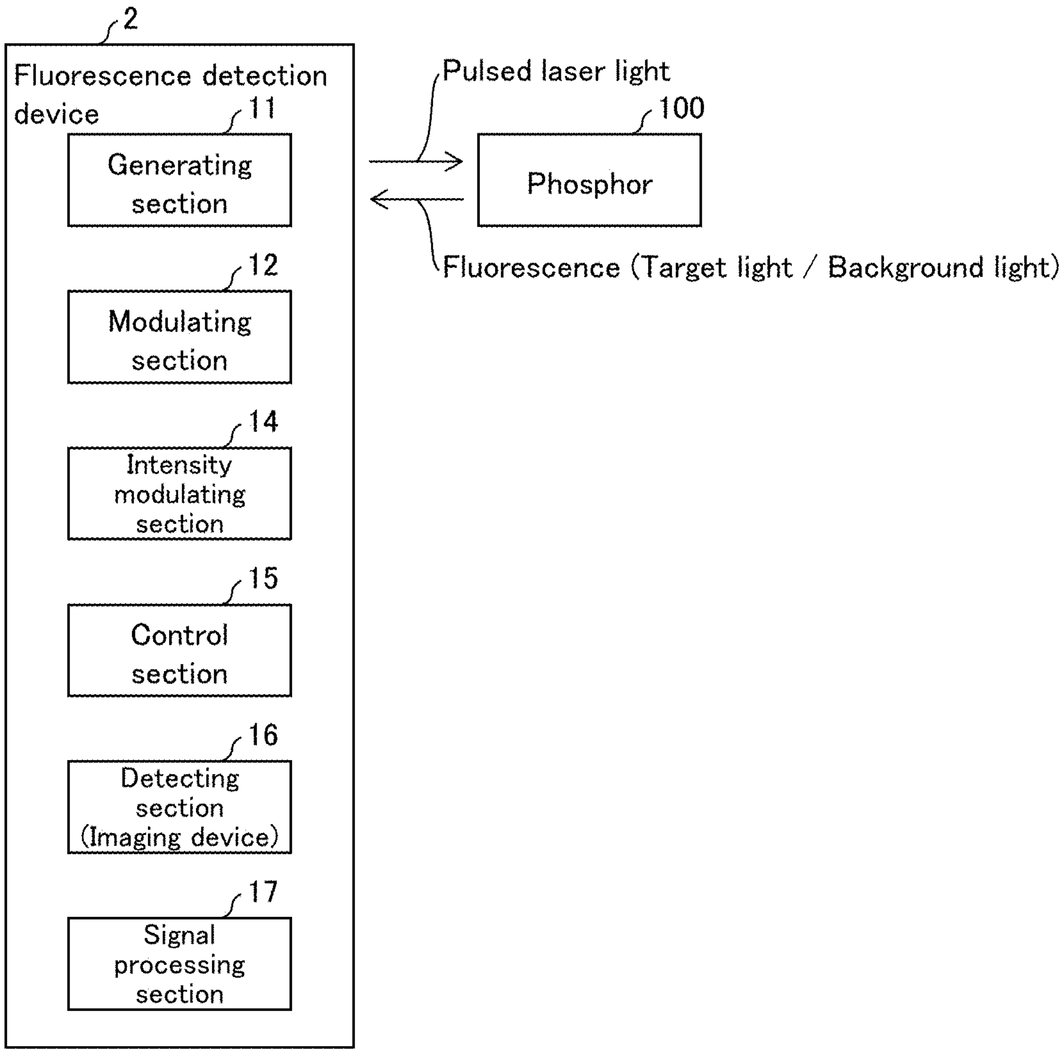
FIG. 4 is a block diagram of a fluorescence detection device 2 in accordance with Embodiment 2.

FIG. 4 is a block diagram illustrating a configuration of a fluorescence detection device 2 in accordance with Embodiment 2 of the present invention. As illustrated in FIG. 4, the fluorescence detection device 2 includes a generating section 11, a modulating section 12, an intensity modulating section 14, a control section 15, a detecting section 16, and a signal processing section 17. Note that the control section 15, the detecting section 16, and the signal processing section 17 are as described in Embodiment 1 and, therefore, descriptions thereof are omitted here.

The generating section 11 generates pulsed laser light which causes spin polarization and spin relaxation in a phosphor that emits fluorescence whose intensity varies according to magnetic resonance. The modulating section 12 modulates the pulse frequency of the pulsed laser light with use of a carrier wave having a first frequency and a first phase. The intensity modulating section 14 modulates the intensity (amplitude) of the pulsed laser light with use of a carrier wave having a second frequency differing from the first frequency and/or a second phase differing from the first phase.

The modulating section 12 may be a first signal generating section that generates a signal for controlling the generating section 11 so that the generating section 11 pulse-oscillates a laser having a pulse frequency of the first frequency and the first phase. The intensity modulating section 14 may be a second signal generating section that generates a signal for controlling the generating section 11 so that the generating section 11 oscillates laser light having intensity of the second frequency and/or the second phase. The fluorescence detection device 2 irradiates a phosphor 100 with the pulsed laser light whose frequency and intensity are modulated.

In the present embodiment, the intensity of target light changes by the modulating section 12 modulating the pulse frequency. Meanwhile, the intensity of the background light changes by the intensity modulating section 14 modulating the intensity. Therefore, it is possible to identify, as the target light, fluorescence whose intensity changes in synchronization with a pattern of modulation of the pulse frequency which modulation is carried out by the modulating section 12, and identify, as the background light, fluorescence whose intensity changes in synchronization with a pattern of modulation of the intensity which modulation is carried out by the intensity modulating section 14.

Note that, in the above embodiment, the generating section 11 has been described as including a single laser oscillator that generates the pulsed laser light. However, the generating section 11 may include two laser oscillators (not illustrated). In this case, one of the laser oscillators is a laser oscillator for changing the intensity of fluorescence emitted from an NV center, and laser light therefrom is modulated by the modulating section 12. The other of the laser oscillators is a laser oscillator for changing the intensity of the background light, and laser light therefrom is modulated by the intensity modulating section 14.

Figure 5:
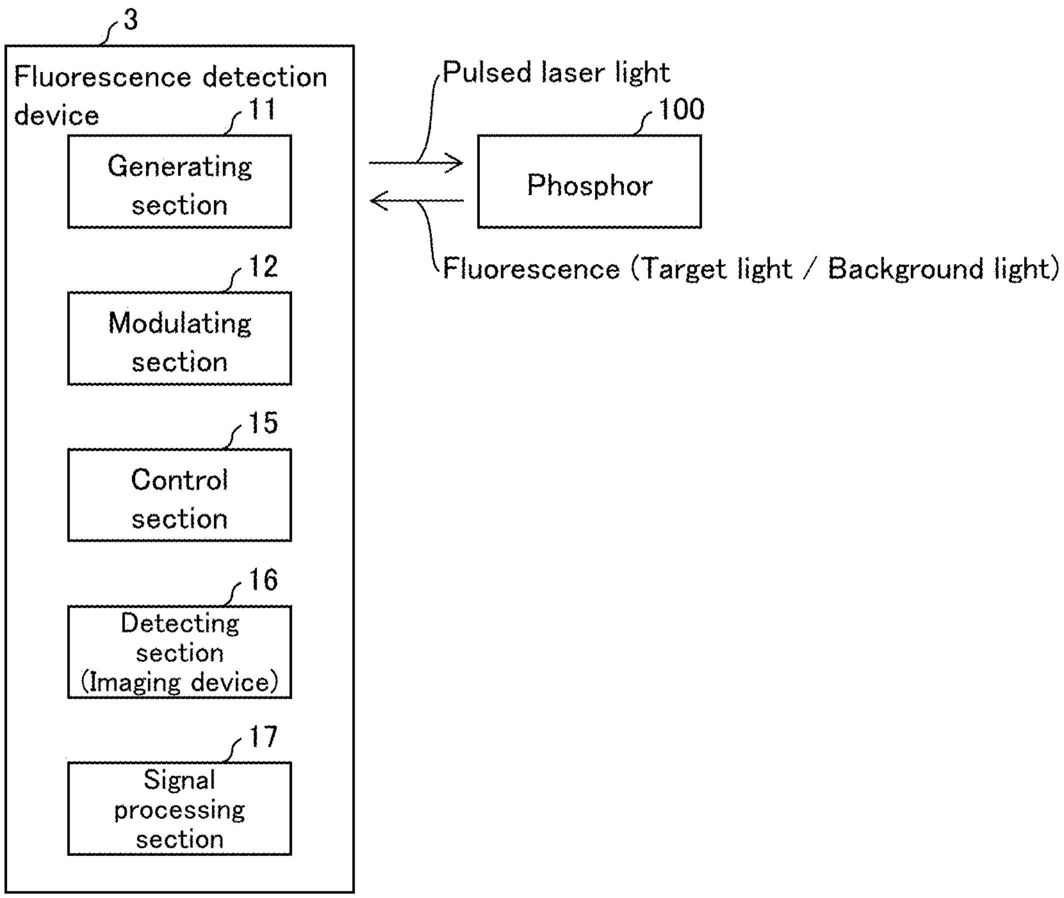
FIG. 5 is a block diagram of a fluorescence detection device 3 including a modulating section 12 that also has a function of an intensity modulating section 14.

Further, as illustrated in FIG. 5, a similar result is obtained also in a configuration in which the modulating section 12 also functions as the intensity modulating section 14. FIG. 5 is a block diagram of a fluorescence detection device 3 including a modulating section 12 that also has a function of an intensity modulating section 14. In the fluorescence detection device 3, the modulating section 12 modulates the pulse frequency and the intensity of a laser generated by the generating section 11 in parallel.

Figure 6:
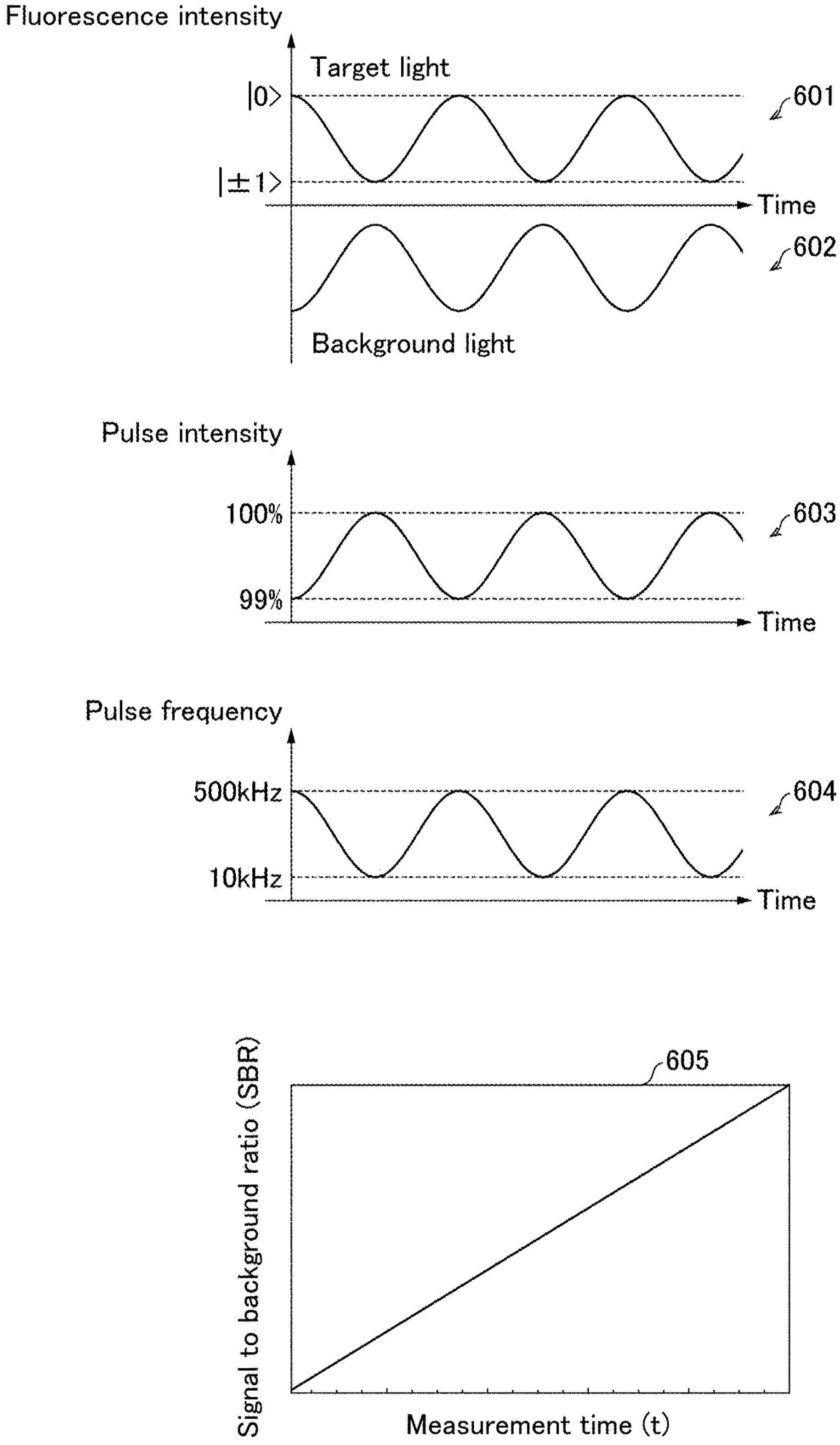
FIG. 6 illustrates (i) a relationship between the pulse frequency of pulsed laser light that changes target light and the intensity of the target light and (ii) a relationship between the pulse intensity of pulsed laser light that changes background light and the intensity of the background light, in accordance with Embodiment 2.

FIG. 6 illustrates (i) a relationship between the pulse frequency of the pulsed laser light that changes the target light and the intensity of the target light and (ii) a relationship between the pulse intensity of the pulsed laser light that changes the background light and the intensity of the background light. Specifically, 603 of FIG. 6 shows a pattern of changes in the pulse intensity of the pulsed laser light, and 604 of FIG. 6 shows a pattern of changes in the pulse frequency of the pulsed laser light. As is clear from these, a phase of changes in the pulse intensity and a phase of changes in the pulse frequency are shifted 180 degrees from each other. Further, 602 of FIG. 6 shows changes in the intensity of the background light, and 601 of FIG. 6 shows changes in the intensity of the target light.

As shown in 601 of FIG. 6, a pattern of changes in the intensity of the target light is shifted 180 degrees from a pattern of changes in the intensity of the background light. It is found from this fact that fluorescence having a pattern of changes in intensity which pattern synchronizes with the pattern of changes in the pulse intensity of the pulsed laser light is the background light and that fluorescence having a pattern of changes in intensity which pattern synchronizes with the pattern of changes in the pulse frequency of the pulsed laser light is the target light. The signal processing section 17 is capable of extracting the target light and the background light separately, by locking in signals having such synchronizing patterns of changes. Note that the amount of the shift between the phase of changes in the pulse intensity and the phase of changes in the pulse frequency does not need to be 180 degrees. However, in a case where the first frequency and the second frequency are the same, 180 degrees is an optimum condition, and, conversely, it is not preferable that the amount of the shift be +90 degrees or −90 degrees. Otherwise, the amount of the shift is not particularly limited. For example, it is particularly preferable that the amount of the shift be 180 degrees±45 degrees.

Note that, in an example shown in 604 of FIG. 6, the pulse frequency is changed between 10 kHz and 500 kHz. However, a modulation range of the pulse frequency is not limited to this example. For example, the modulation range of the pulse frequency may be a range between 100 Hz and 200 MHZ, preferably a range between 1 kHz and 1000 kHz, and more preferably a range between 10 kHz and 500 kHz. By modulating the pulse frequency in such a range, it is possible to carry out measurement with improved accuracy. In a case where the modulated pulse frequency falls below 100 Hz, a measurement time becomes long and time resolution decreases. Therefore, this is not preferable.

Note that the modulation amplitude of the background light is smaller than the modulation amplitude of the fluorescence from the phosphor, the modulation amplitude of the background light being a change in the intensity of the background light which change is caused by the intensity modulating section 14 modulating the intensity, the modulation amplitude of the fluorescence from the phosphor being a change in the intensity of the fluorescence from the phosphor which change is caused by the modulating section 12 modulating the pulse frequency. This makes it possible to detect modulation of the intensity of the target light even in a case where modulation of the intensity of the background light occurs. Note, here, that the modulation amplitude of the background light is a difference between the maximum value and the minimum value of the change in the intensity of the background light shown in 602 of FIG. 6. Note also that the modulation amplitude of the fluorescence is a difference between the maximum value and the minimum value of the change in the intensity of the target light shown in 601 of FIG. 6.

In an example shown in 603 of FIG. 6, the pulse intensity of the pulsed laser light is changed so that the background light oscillates between 99% and 100% of the modulation amplitude of the fluorescence. That is, the pulse intensity is changed so that the intensity of the background light to be measured oscillates between 99% and 100% of the modulation amplitude of the fluorescence. At this time, the modulation amplitude of the background light is said to be 1%. This modulation amplitude of the background light does not need to be 1%, and only needs to be not more than 5%. The lower limit of the modulation amplitude of the background light may be approximately 0.01% or may be even lower. In a case where the lower limit exceeds 5%, an effect is reduced.

As has been described, in the present embodiment, not only the intensity of target light but also the intensity of background light is changed. Therefore, it is possible to use the background light as information for identifying the background light. That is, measurement accuracy is improved by processing data including not only the target light but also the background light. Specifically, a signal to background ratio (SBR) obtained by measurement in the present embodiment is in proportion to a measurement time (t). In contrast, in the conventional technique in which only the target light (signal) is processed, the SBR is in proportion only to the square root of the measurement time (t) because there is no information about the background light (background). That is, it is meant that, in the measurement by the present embodiment, a higher SBR is obtained (detection accuracy is improved) in the same measurement time than in the conventional technique.

Note that, in the above embodiment, the frequency with which the pulse intensity is modulated is the same as the frequency with which the pulse frequency is modulated. However, the frequency with which the pulse intensity is modulated may differ from the frequency with which the pulse frequency is modulated. By identifying fluorescence having intensity that changes in synchronization with each of these frequencies, it is possible to identify the target light and the background light. Note, however, that a condition under the first frequency becomes the second frequency multiplied by an integer of 2 or more or a condition under which the second frequency becomes the first frequency multiplied by an integer of 2 or more should be avoided. Under the other conditions, the frequency with which the pulse intensity is modulated and the frequency with which the pulse frequency is modulated may be made different from each other, as appropriate.

As has been described, included are the generating section 11 that generates pulsed laser light, the modulating section 12 that modulates the pulse frequency of the pulsed laser light with use of a carrier wave having a first frequency and a first phase, and the intensity modulating section 14 that modulates the intensity of the pulsed laser light with use of a carrier wave having a second frequency differing from the first frequency and/or a second phase differing from the first phase. Thus, with a simple configuration of a laser oscillator and a modulating device, it is possible to identify and extract target light and background light. Moreover, by processing data including not only the target light but also the background light, an effect that it is possible to improve measurement accuracy is brought about.

Modifications

Note that, in the above embodiment, an example has been described in which the pulsed laser light is used as excitation light. However, the excitation light is not limited to pulsed light, and may be continuous light. Further, in the above embodiment, an example has been described in which the intensity is modulated by changing the pulse frequency. However, the above embodiment is not limited to this example, and the intensity may be modulated by changing the pulse amplitude.

The present invention is not limited to the embodiments, but can be altered by a skilled person in the art within the scope of the claims. The present invention also encompasses, in its technical scope, any embodiment derived by combining technical means disclosed in differing embodiments.

Example 1

Example 1 of the present invention will be described below with reference to FIGS. 8 to 13. A demonstration experiment was carried out by applying the present technique to an in vitro sample that had been obtained by adsorbing fluorescent nanodiamonds on a coverslip stained with rhodamine-phalloidin (hereinafter referred to as rhodamine). Rhodamine is generally used for intracellular labeling of cytoskeletal actin. Rhodamine emits fluorescence in a wavelength range of 550 nm to 700 nm after being excited by green light. Therefore, even under a measurement condition at a time when a fluorescent nanodiamond is observed, intense fluorescence from rhodamine is observed (a part of 801 of FIG. 8 which part is enclosed by a dotted-line circle, a part which is enclosed by a solid-line circle indicates fluorescence from an NV center).

With use of a CCD camera, exposure was carried out for 100 ms per frame. The exposure and irradiation with pulsed laser light were synchronized such that, during the exposure, irradiation with the pulsed laser light was carried out at 950 pulses/frame and at ejection intervals of 100 μs in each odd-numbered frame and at ejection intervals of 2 μs in each even-numbered frame. The total irradiation intensity in the even-numbered frames was approximately 99% of the total irradiation intensity in the odd-numbered frames.

Figure 8:
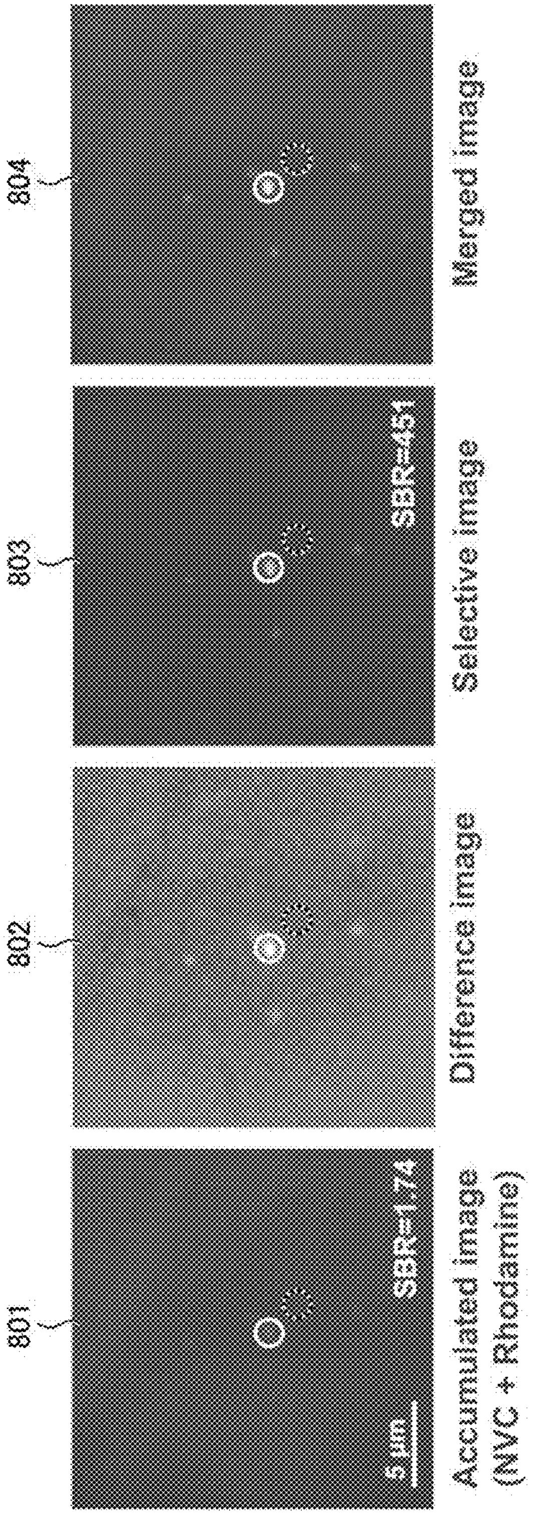
FIG. 8 shows a captured image of an in vitro sample and images obtained by processing the captured image, in accordance with Example 1.
Figure 9:
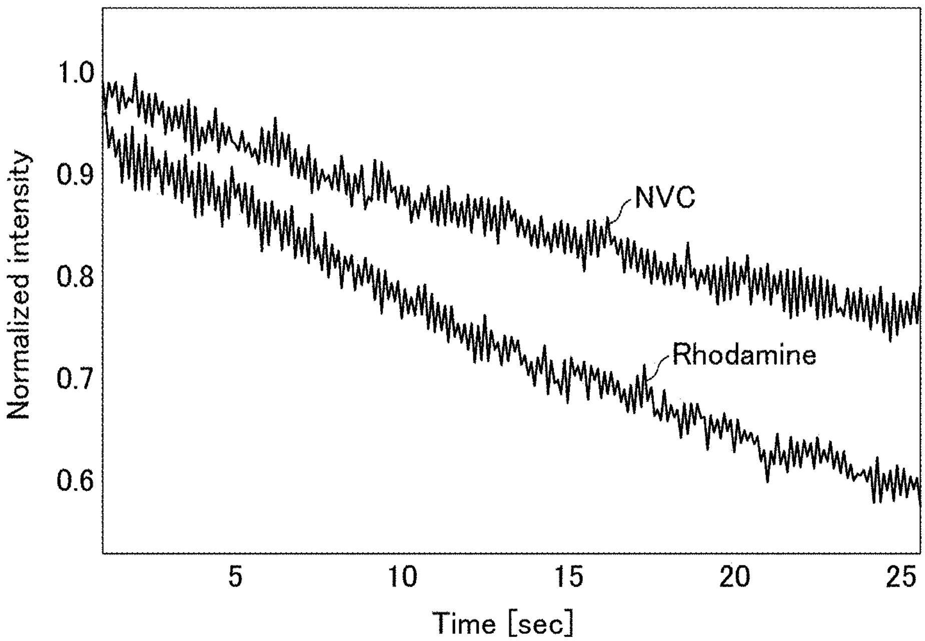
FIG. 9 is a graph showing changes in fluorescence intensity derived from a NVC and rhodamine in the in vitro sample, in accordance with Example 1.
Figure 10:
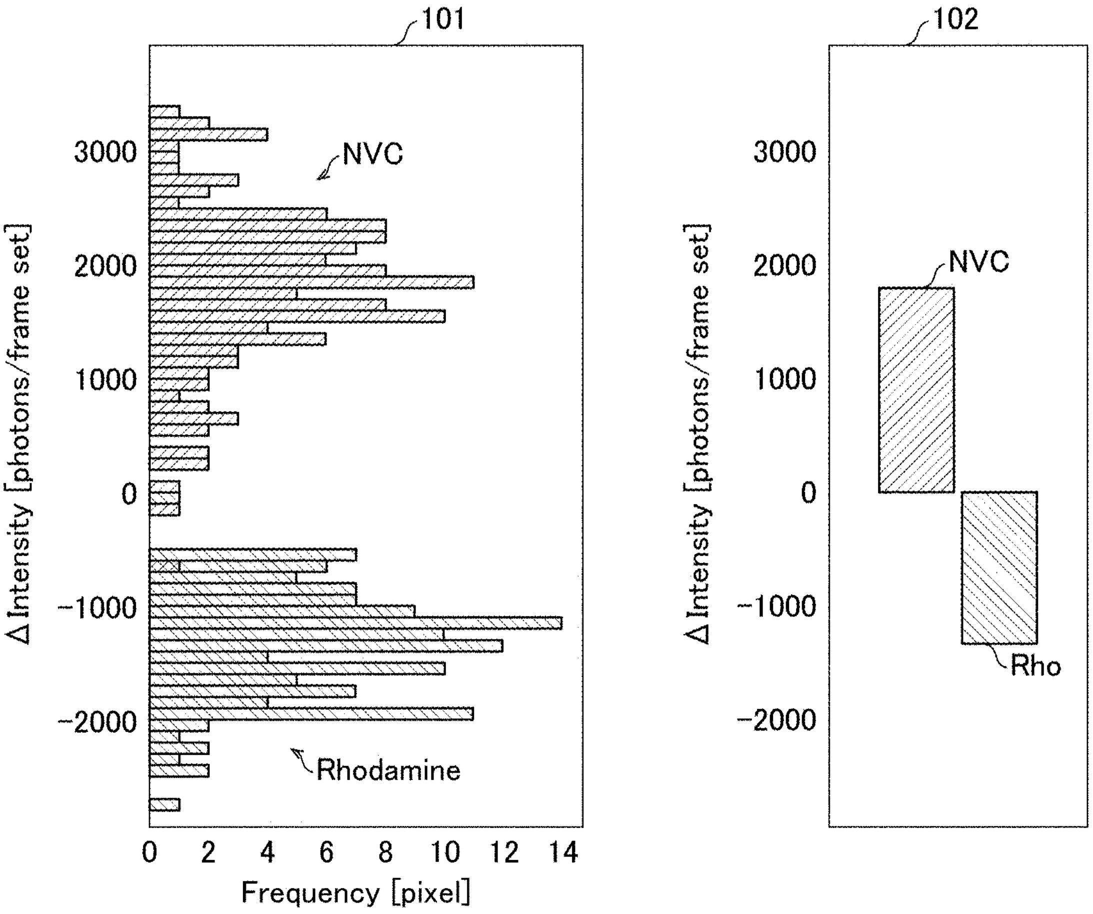
FIG. 10 is a differential intensity distribution of a difference image obtained from an even-numbered frame and an odd-numbered frame of the in vitro sample, in accordance with Example 1.

As a result, fluorescence intensity derived from NVCs and fluorescence intensity derived from the rhodamine varied in the same period and in opposite phase (FIG. 9). A difference image obtained from the even-numbered frame and the odd-numbered frame (802 in FIG. 8) showed a differential intensity distribution similar to that in a simulation (101 of FIG. 10). A difference between a distribution attributed to the NVCs and a distribution attributed to the rhodamine was statistically significant (102 of FIG. 10). By thresholding the difference image at 0, fluorescence from the rhodamine was eliminated, and a selective image of the fluorescent nanodiamonds was obtained (803 of FIG. 8). Note that it was confirmed, also by ODMR frequency spectra, that these bright spots indicated the fluorescent nanodiamonds.

Furthermore, typical signal to background ratios (SBRs) obtained in the experiment were evaluated by comparing fluorescence intensity from derived a fluorescent nanodiamond with fluorescence intensity derived from a rhodamine background (solid-line circles and dotted-line circles in 801 to 804 of FIG. 8). The SBR of an accumulated image made up of 256 frames was 1.74 (801 of FIG. 8), whereas the SBR of the selective image obtained from the same image set was improved to 451 (803 of FIG. 8).

Example 2

Example 2 of the present invention will be described below. Example 2 shows a result of an experiment in which a cultured cell was used. The biological applicability of the present technique was verified by obtaining a selective image of fluorescent nanodiamonds that had been introduced into a living cell stained with a fluorescent dye (FIG. 11).

The fluorescent nanodiamonds were introduced into a HeLa cell (1101 of FIG. 11) by endocytosis. The HeLa cell was stained with a JC-1 fluorescent dye. Then, the present technique was applied. JC-1 is widely used to detect a mitochondrial membrane potential that is an index of a mitochondrial health state associated with apoptosis and necrosis. Mitochondria, on the other hand, have recently become important measurement targets in quantum sensing in which NVCs are used. However, a hem of a fluorescence emission spectrum ($\lambda_{em}$=590) of JC-1 slightly overlaps with a hem of an NVC. Background light caused by this overlapping of the spectra adversely affects detection of a fluorescent nanodiamond in fluorescence imaging (1102 of FIG. 11).

Figure 11:
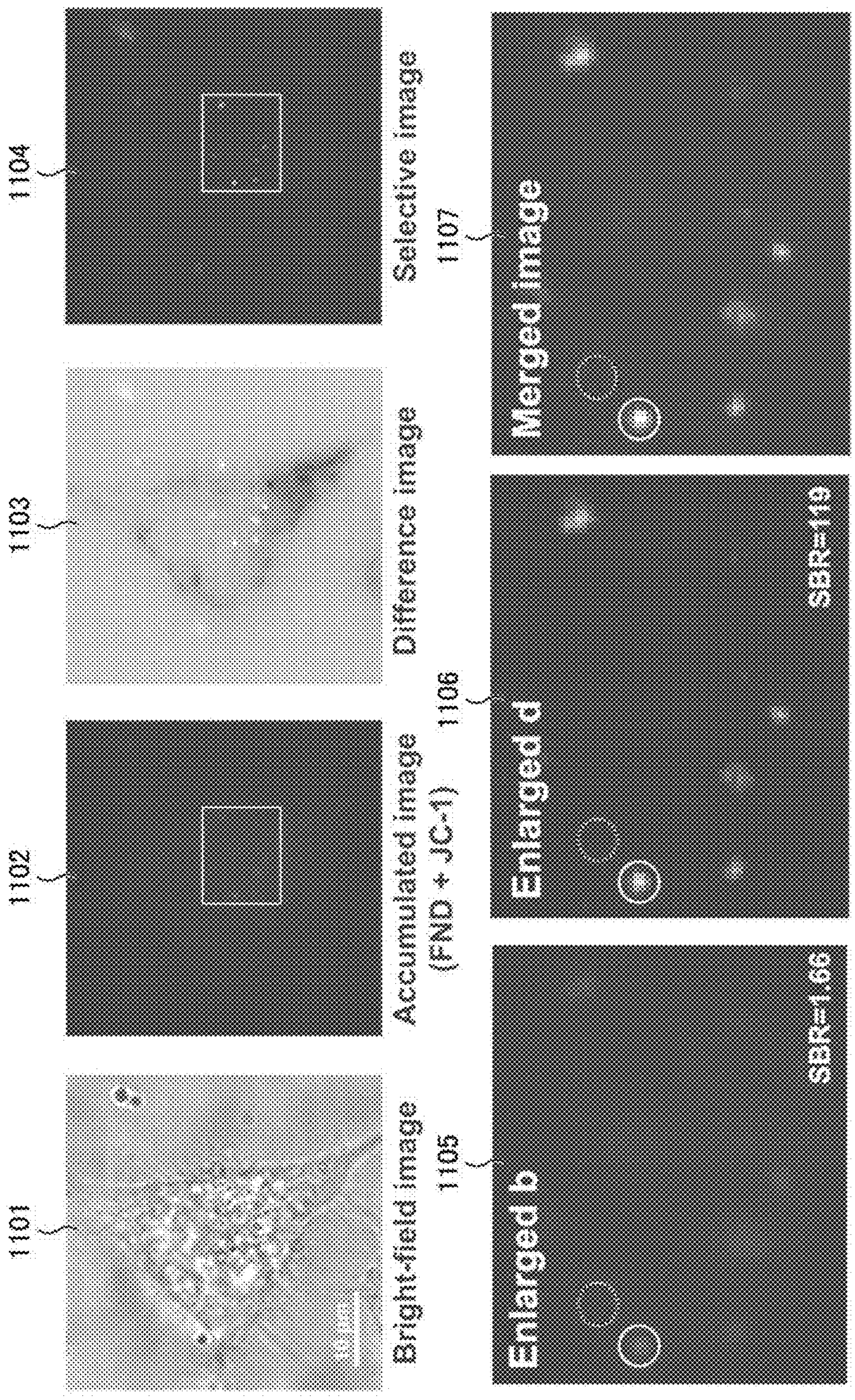
FIG. 11 shows images obtained in a case where fluorescent nanodiamonds were introduced into a HeLa cell stained with a JC-1 fluorescent dye, in accordance with Example 2.

However, it was found that, by using the present technique, a clearer selective image of a fluorescent nanodiamond in a living cell was obtained (1103 and 1104 of FIG. 11). Typical SBRs were evaluated between (i) a fluorescent nanodiamond indicated by a solid-line circle in 1105 of FIG. 11 and (ii) a JC-1 background indicated by a dotted-line circle in 1105 of FIG. 11. The SBRs of an accumulated image and the selective image each obtained from 256 frames (1102 and 1103 of FIG. 11) were respectively 1.66 and 119 (1105 and 1106 of FIG. 11). By applying the present technique, background light (derived from JC-1) was eliminated also in the living cell, and also the SBR was improved not less than 50 times.

Example 3

Example 3 of the present invention will be described below. Biological samples often exhibit particulate autofluorescence caused by intrinsic and extrinsic fluorescent granules. Therefore, the present method is particularly useful in quantitative measurement of an in vivo microenvironment in which measurement a nanodiamond is used as a quantum sensor. For example, *C. elegans* (1201 of FIG. 12) emits intense red particulate autofluorescence, which is referred to as “age pigment” (1202 of FIG. 12). The presence of such particulate autofluorescence makes it extremely difficult to locate a fluorescent nanodiamond that has been introduced into *C. elegans* in an attempt to, for example, measure a temperature.

Figure 12:
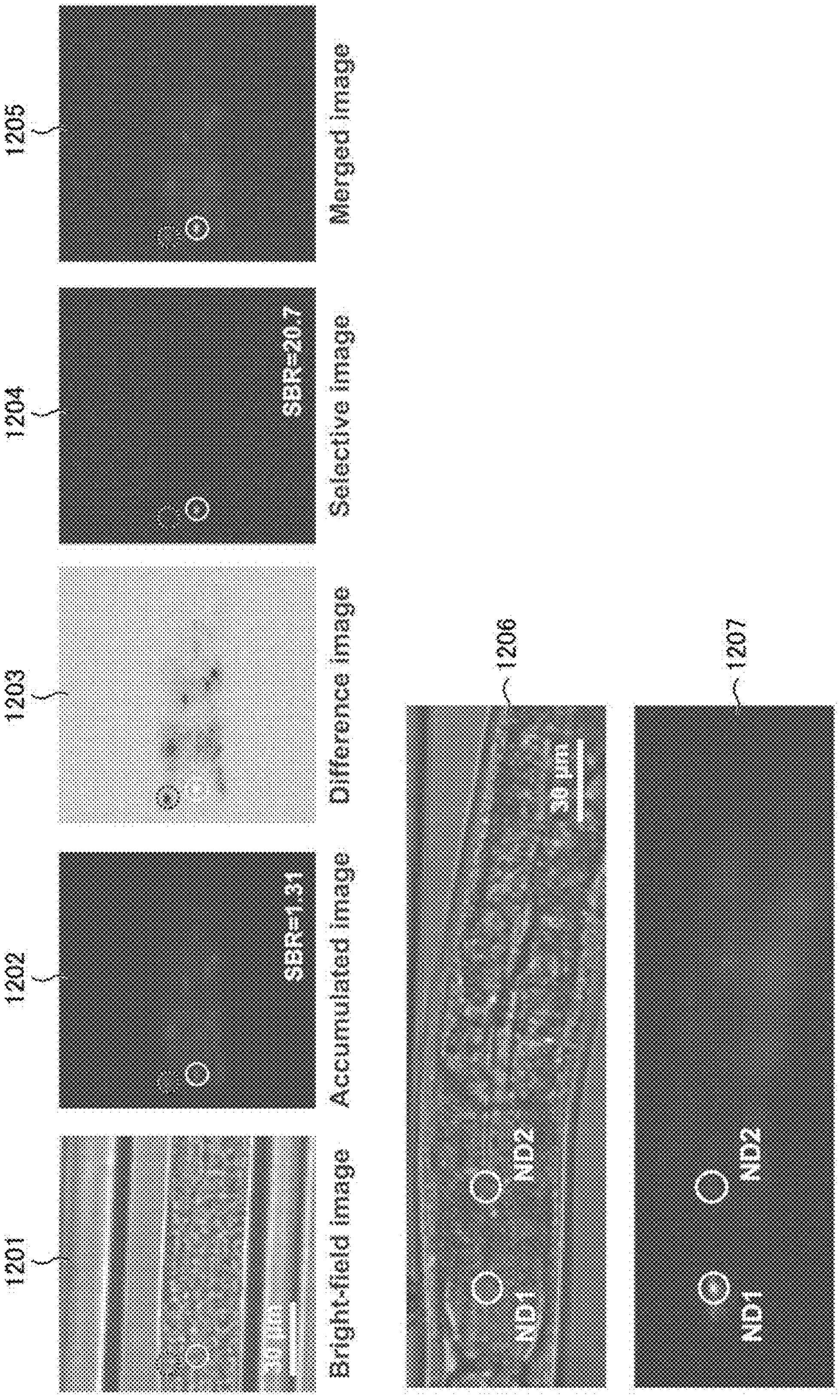
FIG. 12 shows images obtained in a case where fluorescent nanodiamonds were introduced into *C. elegans*, in accordance with Example 3.

However, when the present method was used, it was possible to easily distinguish between fluorescent nanodiamonds and particulate autofluorescence (1203 to 1205 and 1207 of FIG. 12). Typical SBRs were evaluated between (i) a fluorescent nanodiamond indicated by solid-line circles in 1201 to 1205 of FIG. 12 and (ii) particulate autofluorescence indicated by dotted-line circles in 1201 to 1205 of FIG. 12. The SBRs of an accumulated image and a selective image each made up of 256 frames were respectively 1.31 and 20.7 (1202 and 1204 of FIG. 12).

Figure 13:
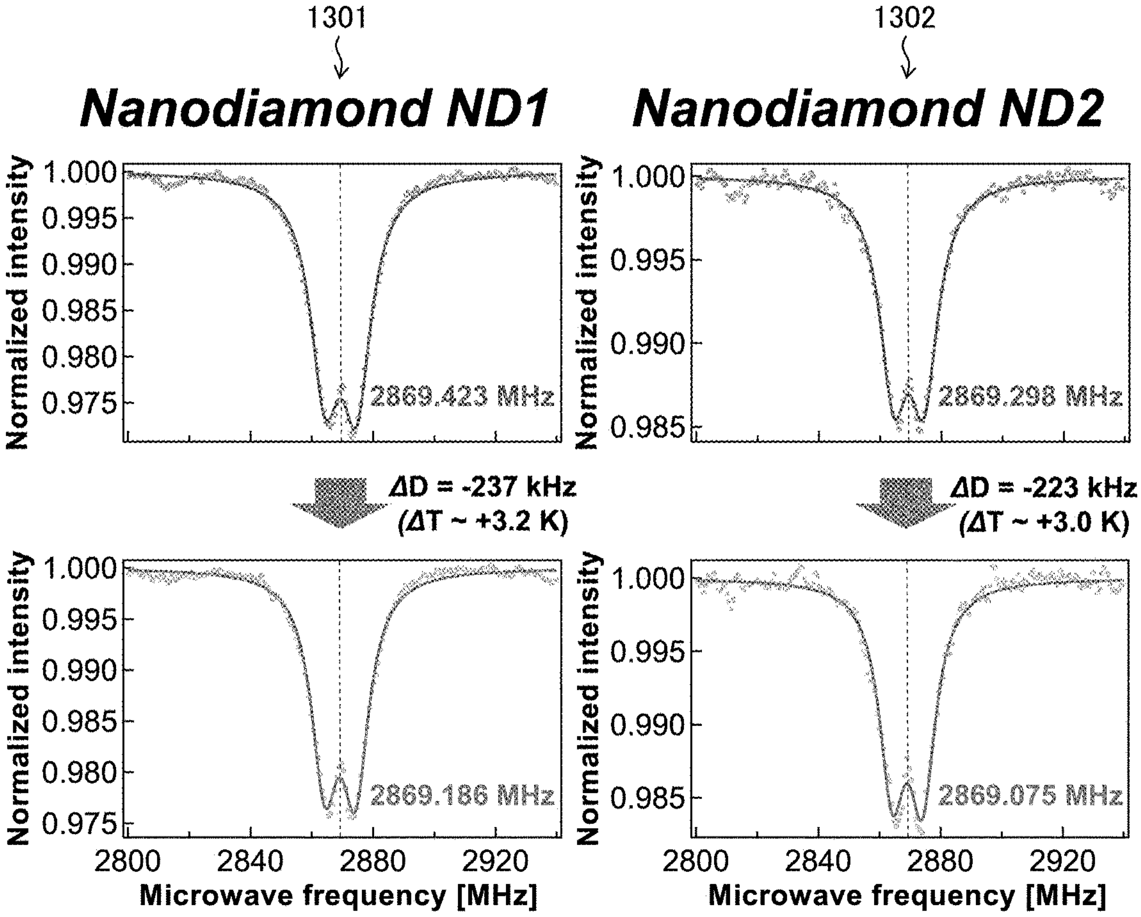
FIG. 13 shows zero-field splitting widths obtained by ODMR frequency spectra, in accordance with Example 3.

In addition, changes in the temperature of living *C. elegans* were also measured with use of fluorescent nanodiamonds that had been located by the present technique. In order to change the temperature of the sample, a heater was placed close to the *C. elegans* sample. With use of ODMR of two fluorescent nanodiamonds that existed relatively close to each other (ND1 and ND2; 1206 and 1207 of FIG. 12), changes in the temperatures of ND1 and ND2 between before and after external heating were simultaneously evaluated. Zero-field splitting widths D obtained by ODMR frequency spectra changed as the temperature of the sample increased (FIG. 13). As shown in 1301 and 1302 of FIG. 13, changes in D in ND1 and ND2 were respectively −237±96 kHz and −223±144 kHz, which respectively corresponded to changes in the temperatures of 3.2±1.3 K and 3.0±1.9 K. As expected, values of changes in two temperatures were relatively similar.

In conventional in vivo measurement in which a fluorescence nanodiamond is used as a quantitative sensor, it is difficult to find the nanodiamond buried in autofluorescence. Thus, much time has been spent. The newly proposed present technique will be a powerful tool in bio-application of a fluorescent nanodiamond.

Example 4

Example 4 of the present invention will be described below. In Example 4, it was demonstrated that the present technique was effective also for a sample of a higher eukaryote, by observing fluorescence nanodiamonds on an ex vivo hippocampus slice obtained from a rat (1401 of FIG. 14).

Before the observation, it was confirmed, with use of a microelectrode array system, that potentials were evoked after electrical stimulation, in order to prove that this hippocampus slice sample was alive. As a result, evoked potentials shown in 1405 of FIG. 14 were observed at a position of a region of interest (a rectangle ahead of an arrow) shown in 1401 of FIG. 14. When the fluorescent nanodiamonds were observed at this position, images with a lower background and higher contrast than those of an accumulated image (1402 of FIG. 14) were obtained by the present technique (1403 and 1404 of FIG. 14), though the hippocampus slice that had been washed well showed extremely low autofluorescence.

Figure 14:
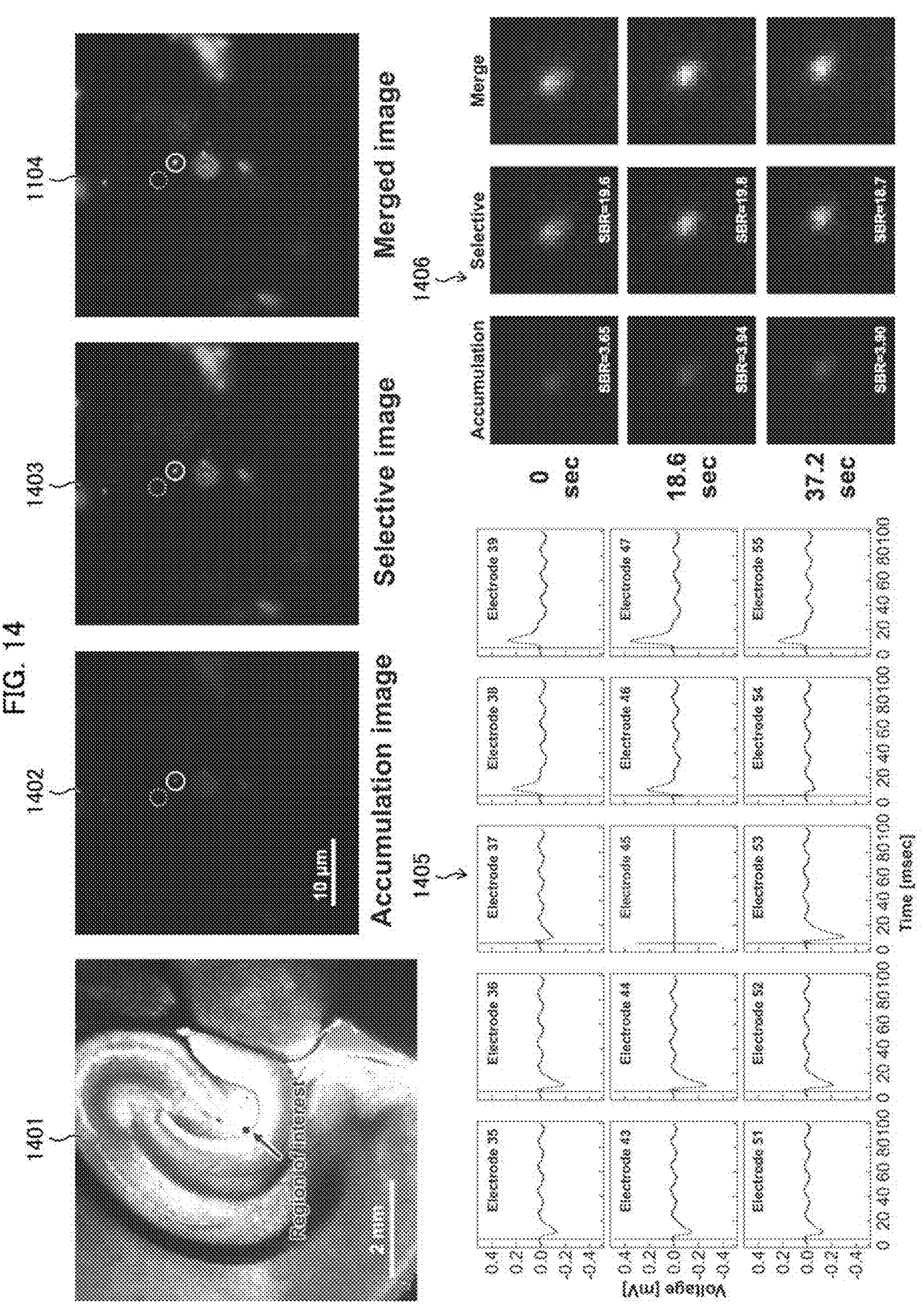
FIG. 14 shows images and evoked potentials obtained in a case where fluorescent nanodiamonds were introduced into an ex vivo hippocampus slice, in accordance with Example 4.

In addition, the selective image was reconstructed as a moving image by creating moving average images by sliding window of 64 frames to 256 frames (1406 of FIG. 14). As a result, translational motions similar to those seen in a moving image of the accumulated image which moving image was created by similar sliding window were observed with a lower background. SBRs were evaluated. As a result, the SBR of the accumulated image in which 256 frames were used was an average of 3.90, whereas the SBR of the selective image in which the same 256 frames were used was an average of 19.3 (1406 of FIG. 14).

A neural circuit of a brain is an important measurement target for an NVC. A cultured hippocampus of a rat is one of the simplest and most controllable experimental model systems for neural circuits in the brains of mammals. Potentials evoked after electrical stimulation, as shown in 1405 of FIG. 14, are generally used for measurement of a neural circuit. However, this method, which relies solely on potentials, is limited only to neural activities in which information to be obtained relates to potentials. Therefore, techniques desired are experimental which provide information about physical and chemical parameters relating to brain cells including glia cells. In particular, the importance of a relationship between a brain function and the pH of a microenvironment begins to attract attention. In recent years, a fluorescent nanodiamond is also expanding its application range also to measurement of not only a temperature and a magnetic field but also a pH. It is considered that measurement of the physical and chemical parameters of a neural circuit of a brain can be carried out with use of a fluorescent nanodiamond. In particular, it is considered that the present technique demonstrates its performance in a case where a recombinant mouse in which a fluorescent protein is expressed is used.

Example 5

Example 5 of the present invention will be described below with reference to FIG. 15. Fluorescent nanodiamonds were each modified with an antibody of phosphorylated tau protein (pTau), and the antibody and pTau were bound. Thereafter, the nanodiamonds each modified with the antibody to which the pTau was bound were bound to an antibody of tau protein (Tau) which antibody was immobilized on a glass substrate, and then fluorescence generated by excitation was imaged.

A method of generating the fluorescence was as follows. The fluorescent nanodiamonds were pulse-irradiated with a green laser having a wavelength of 532 nm as an excitation light source. The intensity of the green laser was modulated by adjusting pulse intensity so that the pulse intensity in even-numbered frames was 99% of the pulse intensity in odd-numbered frames. The intensity of the green laser in the odd-numbered frames was set to 100 mW.

Under the above conditions, the fluorescence from the fluorescent nanodiamonds (target light) and fluorescence from an object other than the fluorescent nanodiamonds (background light) were collected with use of a 20× objective lens, and a fluorescence image obtained through a long pass filter that transmitted light having a wavelength of not less than 650 nm was captured as a moving image with use of an electron multiplier type CCD camera. The moving image was captured by capturing 10 frames per second and capturing frames for 100 seconds to obtain 1000 frames.

Figure 15:
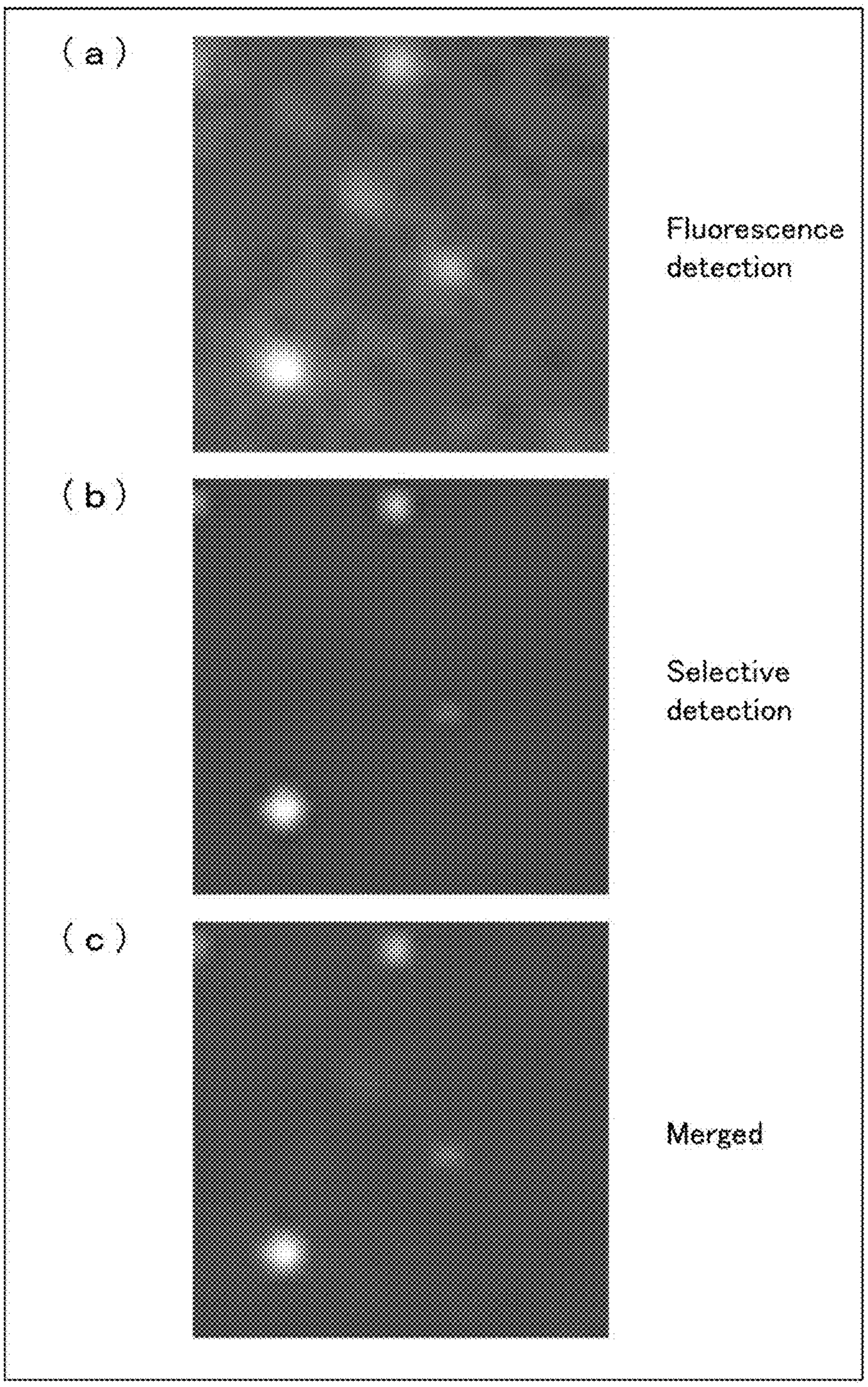
FIG. 15 shows fluorescence images obtained and processed in Example 5.

(a) of FIG. 15 is an accumulated image (fluorescence detection image) of frames which was captured by the above method. In (a) of FIG. 15, the target light and the background light are imaged in the same manner, and thus it is not possible to distinguish between the target light and the background light. (b) of FIG. 15 is a selective image obtained by imaging, in white, only pixels each of which had a pixel difference value greater than zero and which were pixels in a difference image that had been obtained by subtracting, for each pixel, a fluorescence count value of an odd-numbered frame from a fluorescence count value of an even-numbered frame that was adjacent to the odd-numbered frame. In (b) of FIG. 15, only the nanodiamonds modified with the antibody to which the pTau was bound were detected. (c) of FIG. 15 is a merged image obtained by merging the fluorescence detection image and the selective image obtained. Although (c) of FIG. 15 is a black-and-white image and is therefore unclear, it is possible to visually recognize fluorescence as target light by causing the fluorescence present at the same location in the fluorescence detection image and the selective image to be displayed in a different color.

A bright spot visible only in the accumulated image is a bright spot based on the background light, and could be eliminated in the selective image. That is, the bright spot visible in the selective image is the fluorescence derived from the pTau. Tau protein is a substance that causes dementia by abnormally accumulating in a brain. pTau is a biomarker molecule detected by abnormal accumulation thereof. Detecting pTau is important also for diagnosing dementia. By using an antibody-modified nanodiamond as in the present example, it is possible to easily detect phosphorylated tau protein in a body fluid.

REFERENCE SIGNS LIST

1,2,3 Fluorescence detection device
11 Generating section
12 Modulating section
14 Intensity modulating section
15 Control section
16 Detecting section
17 Signal processing section
100 Phosphor

The invention claimed is:

1. A fluorescence detection device comprising:

a generating section that generates pulsed laser light which causes spin polarization and spin relaxation in a phosphor that emits fluorescence whose intensity varies according to magnetic resonance;

a modulating section that modulates a pulse frequency of the pulsed laser light, wherein the modulating section modulates the pulse frequency of the pulsed laser light with use of a carrier wave having a first frequency and a first phase; and an intensity modulating section that modulates intensity of the pulsed laser light with use of a carrier wave having a second frequency differing from the first frequency and/or a second phase differing from the first phase.

2. The fluorescence detection device as set forth in claim 1, wherein the modulating section modulates the pulse frequency of the pulsed laser light within a range of 100 Hz to 200 MHz.

3. The fluorescence detection device as set forth in claim 1, wherein the modulating section also functions as the intensity modulating section.

4. The fluorescence detection device as set forth in claim 1, wherein modulation amplitude of background light is smaller than modulation amplitude of the fluorescence from the phosphor, the modulation amplitude of the background light being a change in intensity of the background light which change is caused by the intensity modulating section modulating the intensity of the pulsed laser light, the modulation amplitude of the fluorescence from the phosphor being a change in the intensity of the fluorescence from the phosphor which change is caused by the modulating section modulating the pulse frequency of the pulsed laser light.

5. The fluorescence detection device as set forth in claim 4, wherein the modulation amplitude of the background light is not more than 5%.

6. The fluorescence detection device as set forth in claim 1, wherein the phosphor contains at least one selected from the group consisting of: an NV center of a diamond which NV center contains a nitrogen atom that substitutes for a carbon atom and a vacancy defect that is adjacent to the nitrogen atom; an SiV center of a diamond which SiV center contains a silicon atom that substitutes for a carbon atom and a vacancy defect that is adjacent to the silicon atom; a $V_{Si}V_C$ center of a silicon carbide crystal which $V_{Si}V_C$ center contains a vacancy defect that substitutes for a silicon atom and a vacancy defect that is adjacent to the vacancy defect; and a $V_{Si}$ center of a silicon carbide crystal which $V_{Si}$ center contains a vacancy defect that substitutes for a silicon atom.

7. A fluorescence detection method comprising the steps of:

generating pulsed laser light which causes spin polarization and spin relaxation in a phosphor that emits fluorescence whose intensity varies according to magnetic resonance;

modulating a pulse frequency of the pulsed laser light; and modulating intensity of the pulsed laser light with use of a carrier wave having a second frequency differing from the pulse frequency.

8. A method for detecting fluorescence which is emitted from a phosphor and whose intensity varies according to magnetic resonance, the method comprising the steps of:

irradiating the phosphor with pulsed laser light so that the phosphor emits the fluorescence;

changing a pulse frequency of the pulsed laser light so that the intensity of the fluorescence emitted from the phosphor is changed; and modulating intensity of the pulsed laser light with use of a carrier wave having a second frequency differing from the pulse frequency.

* * * * *